(12) United States Patent
Liu et al.

(10) Patent No.: US 10,349,548 B1
(45) Date of Patent: Jul. 9, 2019

(54) CASING AND ELECTRONIC DEVICE USING THE SAME

(71) Applicant: Getac Technology Corporation, Hsinchu County (TW)

(72) Inventors: Kuan-Yi Liu, Taipei (TW); Yu-Ying Tseng, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/165,035

(22) Filed: Oct. 19, 2018

(51) Int. Cl.
H05K 5/02 (2006.01)
H05K 7/14 (2006.01)
G06F 1/18 (2006.01)
H05K 5/03 (2006.01)

(52) U.S. Cl.
CPC ......... H05K 7/1427 (2013.01); H05K 5/0217 (2013.01); *G06F 1/181* (2013.01); *H05K 5/03* (2013.01)

(58) Field of Classification Search
CPC ...... H05K 7/1417; H05K 5/0217; H05K 5/03; H05K 7/1404; H05K 7/1427; G06F 1/181; G06F 1/1613
See application file for complete search history.

(56) References Cited

U.S. PATENT DOCUMENTS

| | | | | |
|---|---|---|---|---|
| 7,040,905 B1* | 5/2006 | Wang | .................... | H05K 7/1404 361/759 |
| 2010/0061066 A1* | 3/2010 | Guan | .................... | H05K 9/0026 361/752 |
| 2011/0297414 A1* | 12/2011 | Chen | ....................... | G06F 1/181 174/50 |
| 2012/0044663 A1* | 2/2012 | Lu | ......................... | H05K 9/0026 361/818 |
| 2012/0281386 A1* | 11/2012 | Kim | ...................... | H05K 9/0028 361/818 |
| 2013/0120957 A1* | 5/2013 | Werner | ................ | H05K 9/0032 361/818 |
| 2015/0092337 A1* | 4/2015 | Tan | ....................... | H05K 5/0008 361/679.31 |
| 2015/0189766 A1* | 7/2015 | Fan | ........................... | G06F 1/18 312/223.2 |
| 2017/0127560 A1* | 5/2017 | You | .......................... | H05K 5/03 |
| 2017/0181273 A1* | 6/2017 | Neukam | ............... | H05K 1/0275 |
| 2017/0181298 A1* | 6/2017 | Ahrens | ................ | H05K 5/0008 |
| 2018/0103555 A1* | 4/2018 | Terenzio | ................ | H05K 5/026 |

* cited by examiner

*Primary Examiner* — Abhishek M Rathod
(74) *Attorney, Agent, or Firm* — Locke Lord LLP; Tim Tingkang Xia, Esq.

(57) ABSTRACT

A casing includes a housing having two bent edges and an elastic piece, and a plate. The bent edges are respectively located at two first sides of the housing, and the elastic piece is located at one of two second sides of the housing. Two hook portions of the plate are respectively protruded from the plate and are respectively provided correspondingly to two opening portions of the bent edges. A second coupling portion of the plate is provided correspondingly to a first coupling portion of the elastic piece. When the hook portions respectively pass through the opening portions along a first direction, the bent edges are in contact with the plate, and enter along a second direction a space between the hook portions and the plate, the first coupling portion is in contact with the second coupling portion along a second direction and is coupled with the second coupling portion.

10 Claims, 9 Drawing Sheets

CASING AND ELECTRONIC DEVICE USING THE SAME

BACKGROUND OF THE INVENTION

Field of the Invention

The present invention relates to a casing, and more particularly to a casing and an electronic device using the same.

Description of the Prior Art

A current computer apparatus includes a casing and a motherboard. The motherboard is provided with an electronic circuit module, the casing includes a plate and a housing, the motherboard can be fixed on the plate, and the housing covers the motherboard and is similarly fixed on the plate. In general, a fixing means between the plate and the housing is achieved by a corresponding fastening structure. For example, multiple screw holes are respectively provided on the plate and on the housing, and positions of these screw holes on the plate and the housing are mutually corresponding. For assembly, operation staff first aligns the multiple screw holes on the plate with the multiple screw holes on the housing, and applies a force to press the plate on the housing, so as to temporarily keep relative positions of the plate and the housing unchanged. The operation staff then sequentially places screws having appropriate specifications in the screw holes on the plate and on the housing, and fastens the screws by a screwdriver, so as to fix the plate and the housing together.

SUMMARY OF THE INVENTION

The assembly process of a casing of a current computer apparatus mostly adopts screws as a fastening structure. Such assembly process requires long assembly hours, as operation staff is required to spend time on aligning screw holes, while holding screws and fastening the screws by a screwdriver, and is thus time-consuming as well as labor-consuming. Further, the screws themselves further increase overall material costs. In addition, subsequent processes such as tapping or copper nail embedding are required at positions of the screws on the plate in order to securely fasten the screws, resulting in additional labor costs and material costs of the copper nails.

In view of the above, it is an object of the present invention to provide a casing so as to quickly complete assembly and disassembly of a casing without using any screws and other types of tool.

In one embodiment of the present invention, a casing includes a housing and a plate. The housing includes two first sides opposite each other, two second sides opposite each other, two bent edges opposite each other, and an elastic piece. The two bent edges are respectively located at the two first sides of the housing, and the elastic piece is located at one of the two second sides of the housing. Each of the bent edges includes an opening portion. The elastic piece includes a first coupling portion. The plate includes two hook portions and a second coupling portion. The two hook portions are respectively protruded from the plate and are respectively provided correspondingly to the two opening portions of the two bent edges, and the second coupling portion is provided correspondingly to the first coupling portion. When the two hook portions respectively pass through the two opening portions along a first direction, the two bent edges come into contact with the plate and respectively enter along a second direction a space between the hook portions and the plate, and the first coupling portion comes into contact with the second coupling portion along a second direction and is coupled with the second coupling portion. Thus, the two hook portions limit the movement of the housing in the first direction, and the second coupling portion limits the movement of the housing in the second direction.

In one embodiment of the present invention, an electronic device includes the foregoing casing and a circuit board. The circuit board is provided on the plate, and the circuit board is located between the plate and the housing.

In conclusion, in regard to the casing according to the embodiments of the present invention, assembly and disassembly of the casing can be quickly completed without using screws and other types of tool. Therefore, the present invention is time-saving and labor-saving, and is further capable of reducing overall material costs.

Details of features and advantages of the present invention are given in the following embodiments with the accompanying drawings below. The disclosure is sufficient for a person skilled in the art to understand and accordingly implement the technical contents of the present invention. Further, on the basis of the contents, claim scope and drawings disclosed by the application, a person skilled in the art can easily appreciate objects and advantages related to the present invention.

DETAILED DESCRIPTION OF THE EMBODIMENTS

Figure 1:
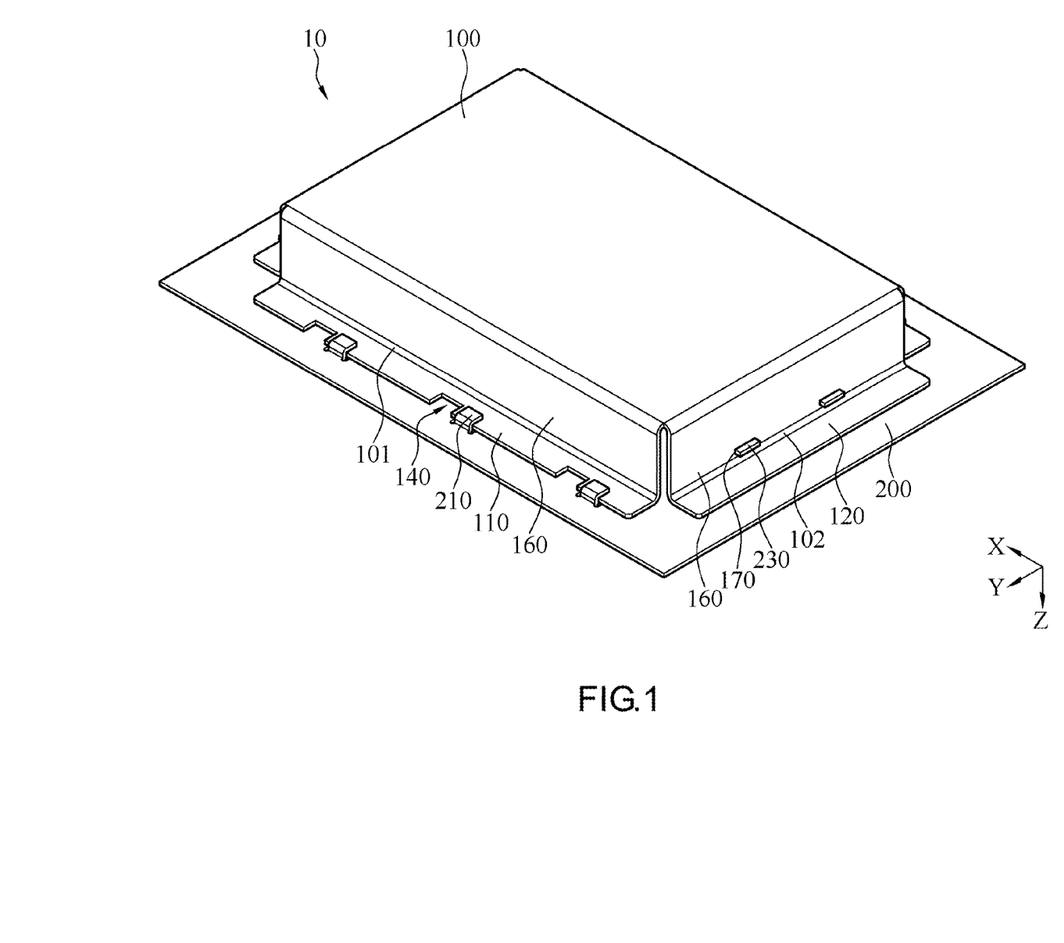
FIG. 1 is a schematic diagram of a casing according to an embodiment of the present invention.
Figure 2:
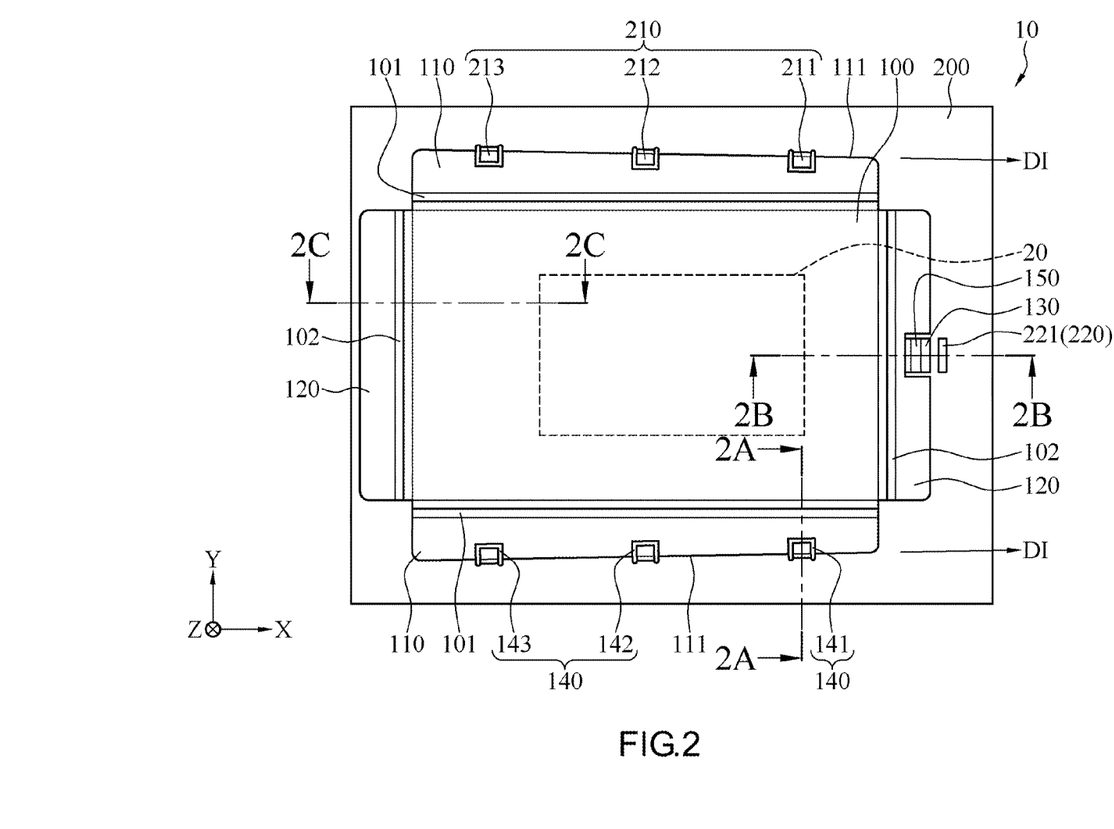
FIG. 2 is a top view of a casing according to an embodiment of the present invention.

FIG. 1 shows a schematic diagram of a casing 10 according to an embodiment of the present invention. FIG. 2 shows a top view of the casing 10 according to an embodiment of the present invention. Referring to FIG. 1 and FIG. 2, the casing 10 in FIG. 1 is in an assembled state, and the casing 10 in FIG. 2 is in a non-assembled state. In this embodiment, the casing 10 is applicable to an electronic device, which is, for example but not limited to, an all-in-one (AIO) computer or a display screen. The electronic device includes the casing 10 and a circuit board 20. The circuit board 20 is provided thereon with an electronic circuit module such as a processor, a memory and a hard drive. The casing 10 includes a housing 100 and a plate 200. The circuit board 20 is provided on the plate 200, and the housing 100 covers the circuit board 20 and is fixed on the plate 200, that is, the circuit board 20 is located between the plate 200 and the housing 100. The housing 100 and the plate 200 may be simply and quickly fixed together or separated without using any screws or other types of tool, with associated details to be described shortly.

As shown in FIG. 1 and FIG. 2, in this embodiment, the housing 100 includes two first sides 101 opposite each other, and two second sides 102 opposite each other. The housing 100 further includes two first bent edges 110, two second bent edges 120 and an elastic piece 130. The two first bent edges 110 are opposite each other and are respectively located at the two first sides 101, and each of the first bent edges 110 extends outwards from the corresponding first side 101. The two second bent edges 120 are opposite each other and are respectively located at the two second sides 102, and each of the second bent edges 120 extends outwards from the corresponding second side 102. The elastic piece 130 is located at one of the two second sides 102; in other words, the elastic piece 130 and one of the second bent edges 120 are together located at one of the second bent edges 102. In this embodiment, the first bent edge 110, the second bent edges 120 and the housing 100 are, for example but not limited to, a formed integral, and the first bent edges 110 and the second bent edges 120 are formed by, for example but not limited to, respectively bending along the first sides 101 and the second sides 102.

As shown in FIG. 1 and FIG. 2, in this embodiment, each first bent edge 110 includes an opening portion 140, and the elastic piece 130 includes a first coupling portion 150. Correspondingly, the plate 200 includes two hook portions 210 and a second coupling portion 220. The two hook portions 210 mutually symmetrically protrude from the plate 200, the two hook portions 210 are respectively provided correspondingly to the two opening portions 140 of the two first bent edges 110, and the second coupling portion 220 is provided correspondingly to the first coupling portion 150.

As shown in FIG. 1 and FIG. 2, due to the circuit board 20 located on the plate 200, to prevent mutual interference of the housing 100 and the circuit board 20 during an assembly process of the housing 100 and the plate 200, operation staff may first locate the housing 100 at a certain distance from the plate 200 and align the housing 100 in a first direction with the plate 200 and the circuit board 20 (in this embodiment, if the plate 200 is located on an XY plane as a reference, the first direction is a direction parallel to the Z-axis, and is to be referred to as a Z-axis). The operation staff then may move the housing 100 along the Z-axis and towards the plate 200 until the housing 100 comes into contact with the plate 200, and then move the housing 100 along a second direction and have the housing 100 couple with the plate 200 (in this embodiment, the second direction is an axis parallel to the X-axis, and is to be referred to as the X-axis), wherein the first direction is perpendicular to the second direction. In other words, given a distance between the housing 100 and the plate 200 in the Z-axis, the opening portion 140 is first aligned along the Z-axis with the hook portion 210. As such, when the housing 100 moves along the Z-axis and towards the plate 200 until it comes into contact with the plate 200, the two hook portions 210 of the plate 200 pass through the two opening portions 140 of the housing 100 along the Z-axis, in a way that the housing 100 is not blocked by the hook portions 210, and the two first bent edges 110 and the two second bent edges 120 of the housing 100 can successfully come into contact with the plate 200. Next, the operation staff may move the housing 100 along the X-axis to couple the housing 100 with the plate 200. During this process, the two first bent edges 110 correspondingly move along the X-axis to enter a space between the two hook portions 210 and the plate 200, respectively. Further, the first coupling portion 150 correspondingly moves along the X-axis until the first coupling portion 150 comes into contact with the second coupling portion 220 and is coupled with the second coupling portion 220. At this point, the two hook portions 210 limit the movement of the housing 100 in the Z-axis and relative to the plate 200, and the second coupling portion 220 limits the movement of the housing 100 in the X-axis and relative to the plate 200. Further, the two hook portions 210 can limit the movement of the housing 100 in a third direction (in this embodiment, the third direction is a direction parallel to the Y-axis, and is to be referred to as the Y-axis) and relative to the plate 200, wherein the third direction is perpendicular to the first direction and the second direction.

As shown in FIG. 2, in this embodiment, each of the hook portions 210 includes a first hook 211 and a second hook 212, and the first hook 211 and the second hook 212 are provided at an interval on the X-axis. Each of the opening portions 140 includes a first opening 141 and a second opening 142, and the first opening 141 and the second opening 142 are provided at an interval on the X-axis. The first opening 141 is provided correspondingly to the first hook 211, and the second opening 142 is provided correspondingly to the second hook 212.

As shown in FIG. 2, in this embodiment, each of the hook portions 210 further includes a third hook 213, and the first hook 211, the second hook 212 and the third hook 213 are provided at intervals on the X-axis. Each of the opening portions 140 further includes a third opening 143, and the first opening 141, the second opening 142 and the third opening 143 are provided at intervals on the X-axis. The third opening 143 is provided correspondingly to the third hook 213. In some embodiments, the hook portion 210 may include only one hook, and the opening portion 140 may include only one opening provided correspondingly to the hook. In some embodiments, for example but not limited to, the hook portion 210 may include four or more hooks provided at intervals on the X-axis, and the opening portion 140 may include four or more openings provided correspondingly to the hooks. Further, the housing 100 may be provided with, e.g., a support structure, for bearing the electronic device, and the bearing force provided by the hooks gets large as the number of hooks increases, hence providing the support structure with a bearing capable of bearing a greater weight.

Figure 2A:
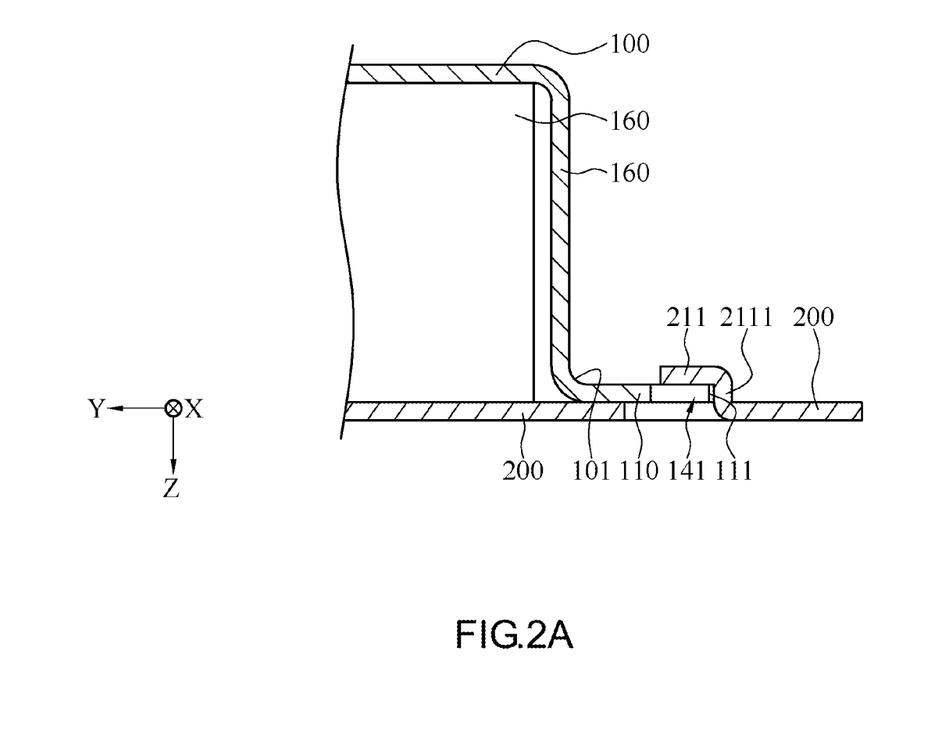
FIG. 2A is a section view of FIG. 2 along a section line 2A-2A.

Refer to FIG. 2A showing a section view of FIG. 2 along a section line 2A-2A. As shown in FIG. 1 to FIG. 2A, in this embodiment, the first opening 141 is aligned along the Z-axis on an XY plane with the first hook 211; when the housing 100 moves along the Z-axis and towards the plate 200 until it comes into contact with the plate 200, the first hook 211 passes through the first opening 141 along the Z-axis until the first bent edge 110 comes into contact with the plate 200. In this embodiment, the first hook 211 is formed by, for example but not limited to, first cutting a predetermined position of the plate 200 and then bending the cut part in the Z-axis. The first hook 211 has a bent wall 2111. The bent wall 2111 forms in the Z-axis a height difference of the first hook 211 relative to the plate 200, wherein the height difference is substantially the thickness of the first bent edge 110. FIG. 2A shows a section view of a position of the first hook 211. FIG. 2A is primarily for illustrating structures and relationships of the first hook 211, the first bent edge 110 and the first opening 141. The structures and relationships of the second hook 212, the first bent edge 110 and the second opening 142, and those of the third hook 213, the first bent edge 110 and the third opening 143 may be referred from FIG. 2A and the foregoing description, and are omitted herein.

As shown in FIG. 1 to FIG. 2A, in this embodiment, the housing 100 further includes a wall 160. The wall 160 forms in the Z-axis a height difference of the housing 100 relative to the plate 200, such that an accommodating space is formed between the housing 100 and the plate 200, and the circuit board 20 is located in the accommodating space. In this embodiment, the first bent edge 110 and the second bent edge 120 are formed by, for example but not limited to, respectively bending extended parts of the wall 160.

Figure 2B:
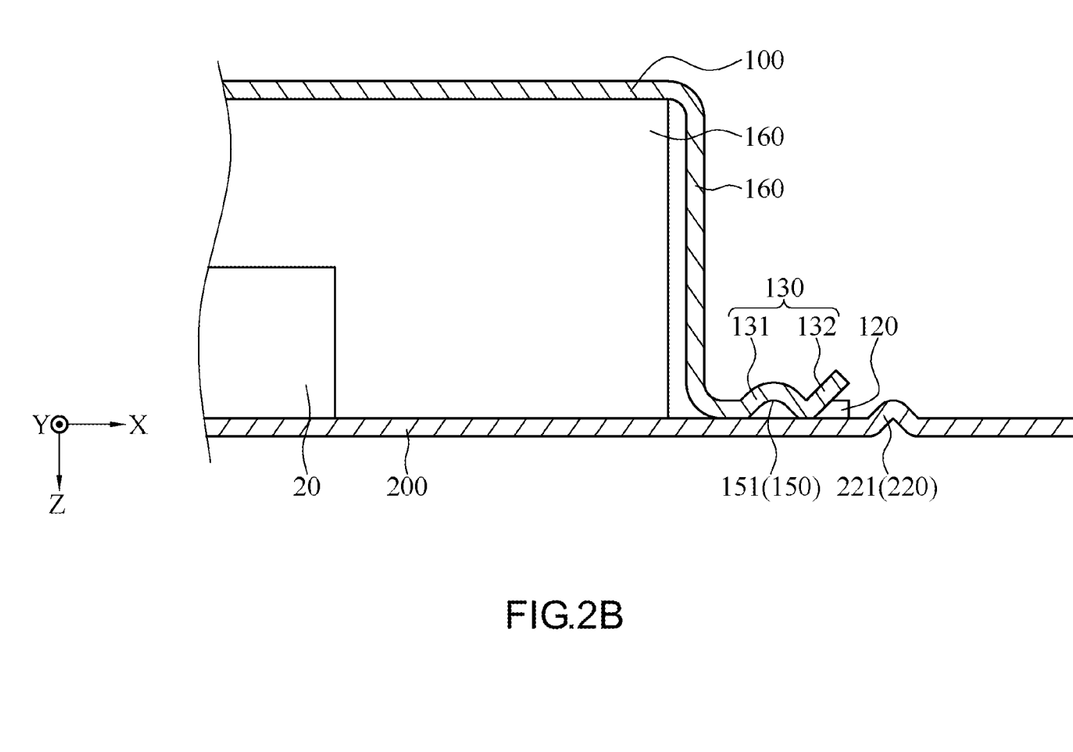
FIG. 2B is a section view of FIG. 2 along a section line 2B-2B.

Refer to FIG. 2B showing a section view of FIG. 2 along a section line 2B-2B. As shown in FIG. 1, FIG. 2 and FIG. 2B, in this embodiment, the first coupling portion 150 includes a recess 151, the second coupling portion 220 includes a protrusion 221 corresponding to the recess 151, and the protrusion 221 is for fitting in the recess 151 so as to mutually couple the first coupling portion 150 and the second coupling portion 220. In some embodiments, the first coupling portion 150 may also include the protrusion 221, and the second coupling portion 220 may include the recess 151 corresponding to the protrusion 221. In this embodiment, the elastic piece 130 includes an abutting section 131 and a warping section 132. The abutting section 131 located between the waring section 132 and the housing 100, and the first coupling portion 150 is located at the abutting section 131. When the housing 100 is in contact with the plate 200, the abutting section 131 is also in contact with the plate 200, and the warping section 132 is connected to the abutting section 131 and extends towards a direction away from the plate 200. In this embodiment, the elastic piece 130 is formed by cutting and bending the adjacent second bent edge 120. In some embodiments, the housing 100 may have only the first bent edges 110 but not the second bent edges 120. In the above situation, the elastic piece 130 may be formed by bending the extended part of the wall 160 located at the second side 102.

Figure 2C:
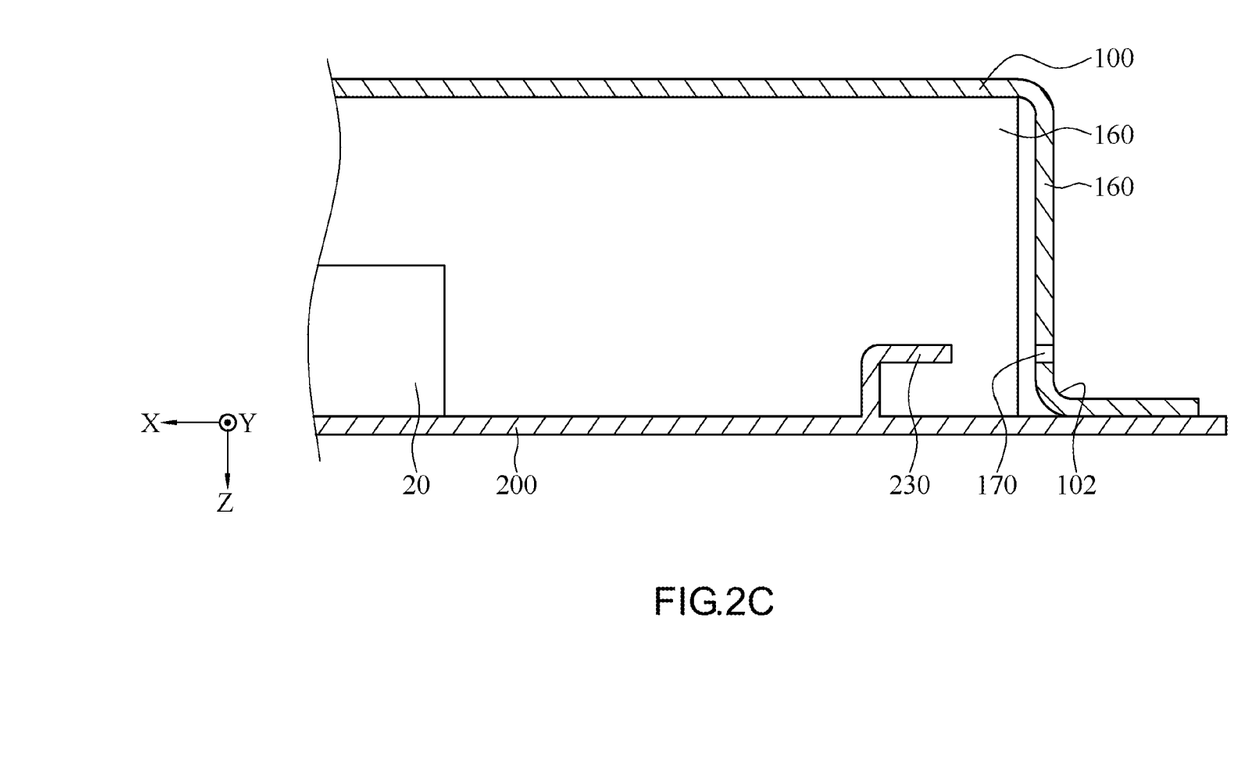
FIG. 2C is a section view of FIG. 2 along a section line 2C-2C.

Refer to FIG. 2C showing a section view of FIG. 2 along a section line 2C-2C. As shown in FIG. 1, FIG. 2 and FIG. 2C, in this embodiment, the housing 100 further includes a limiting hole 170, which is located at one other of the two second sides 102 and is away from the elastic piece 130. For example, the limiting hole 170 is provided on the wall 160 located at the second side 102 and away from the elastic piece 130. The plate 200 may be provided with a protruding limiting plate 230. The limiting plate 230 is provided correspondingly to the limiting hole 170, and may be inserted along the X-axis into the limiting hole 170. Further, an aperture outline of the limiting hole 170 on the YZ plane matches a section outline of the limiting plate 230 on the YZ plane. Thus, the limiting plate 230 and the limiting hole 170 can coordinate with each other to limit the movement of the housing 100 in the Z-axis and the Y-axis.

Figure 3:
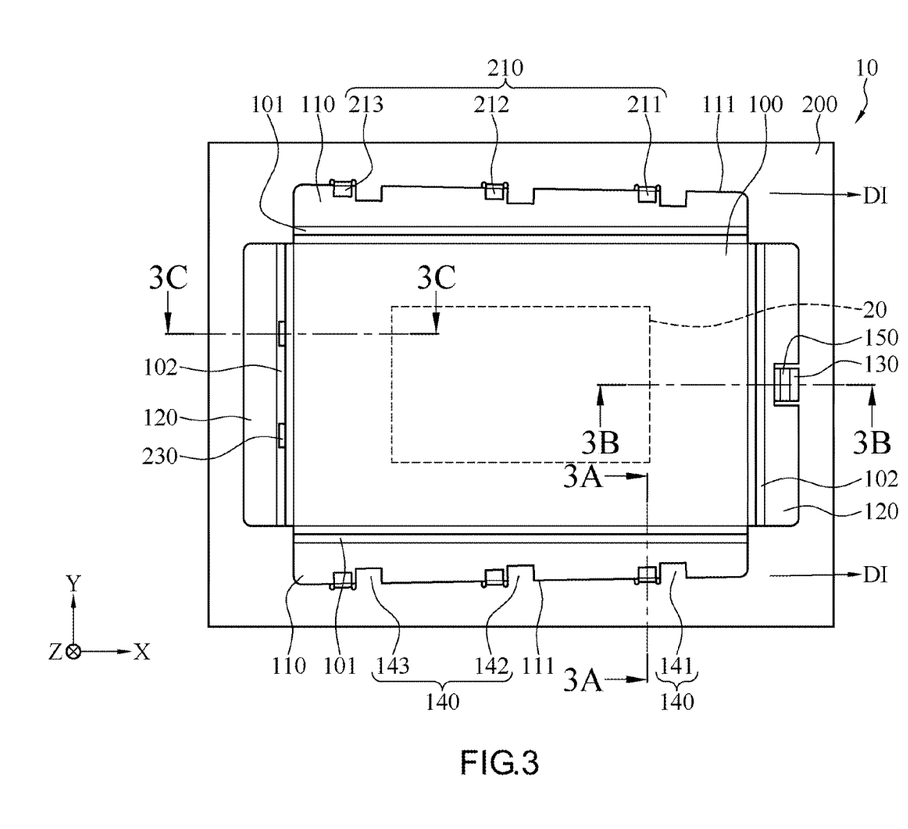
FIG. 3 is a top view of a casing according to an embodiment of the present invention.

Refer to FIG. 3 showing a top view of the casing 10 according to an embodiment of the present invention, wherein the casing 10 in FIG. 3 is completely assembled; that is, FIG. 3 is a top view of the casing 10 in FIG. 1. The housing 100 in FIG. 2 is in contact with the plate 200 but the casing 10 is not yet assembled, whereas the casing 10 in FIG. 1 and FIG. 3 show a state of the housing 100 in FIG. 2 further moved along the X-axis and relative to the plate 200. As shown in FIG. 3, in this embodiment, the first bent edge 110 enters a space between the hook portion 210 and the plate 200, that is, the hook portion 210 completely overlaps the first bent edge 110 in the Z-axis. Further, the opening portion 140 is completely moved out of the hook portion 210, that is, the opening portion 140 is completely non-overlapping with the hook portion 210 in the Z-axis.

Figure 3A:
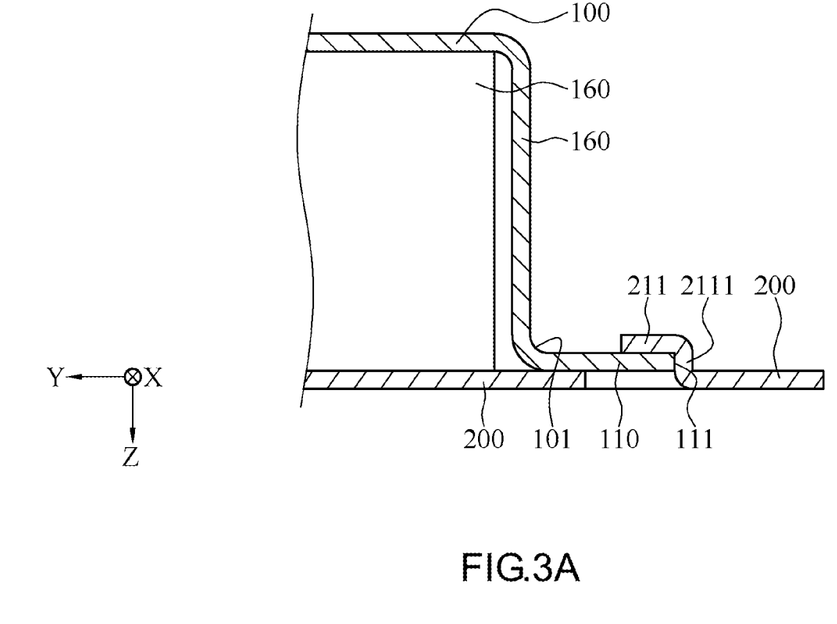
FIG. 3A is a section view of FIG. 3 along a section line 3A-3A.

Refer to FIG. 3A showing a section view of FIG. 3 along a section line 3A-3A. As shown in FIG. 3 and FIG. 3A, in this embodiment, the first bent edge 110 is located between the first hook 211 and the plate 200, that is, the first hook 211 overlaps with the first bent edge 110 in the Z-axis, and the first hook 211 abuts in the Z-axis against the first bent edge 110; in other words, the first hook 211 and the plate 200 mutually clamp the first bent edge 110. FIG. 3A shows a section view of a position of the first hook 211. FIG. 3A is primarily for illustrating the structures and relationships of the first hook 211 and the first bent edge 110. The structures and relationships of the second hook 212 and the first bent edge 110, and those of the third hook 213 and the first bent edge 110 can be referred from FIG. 3A and the foregoing description, and are omitted herein.

As shown in FIG. 3 and FIG. 3A, in this embodiment, the two hook portions 210 and the two first bent edges 110 further abut against each other in the Z-axis, and the two hook portions 210 limit the movement of the housing 100 in the Z-axis and relative to the plate 200. In other words, by the mutual abutment of the hook portions 210 and the first bent edges 110, relative positions of the housing 100 and the plate 200 in the Z-axis are fixed.

Figure 3B:
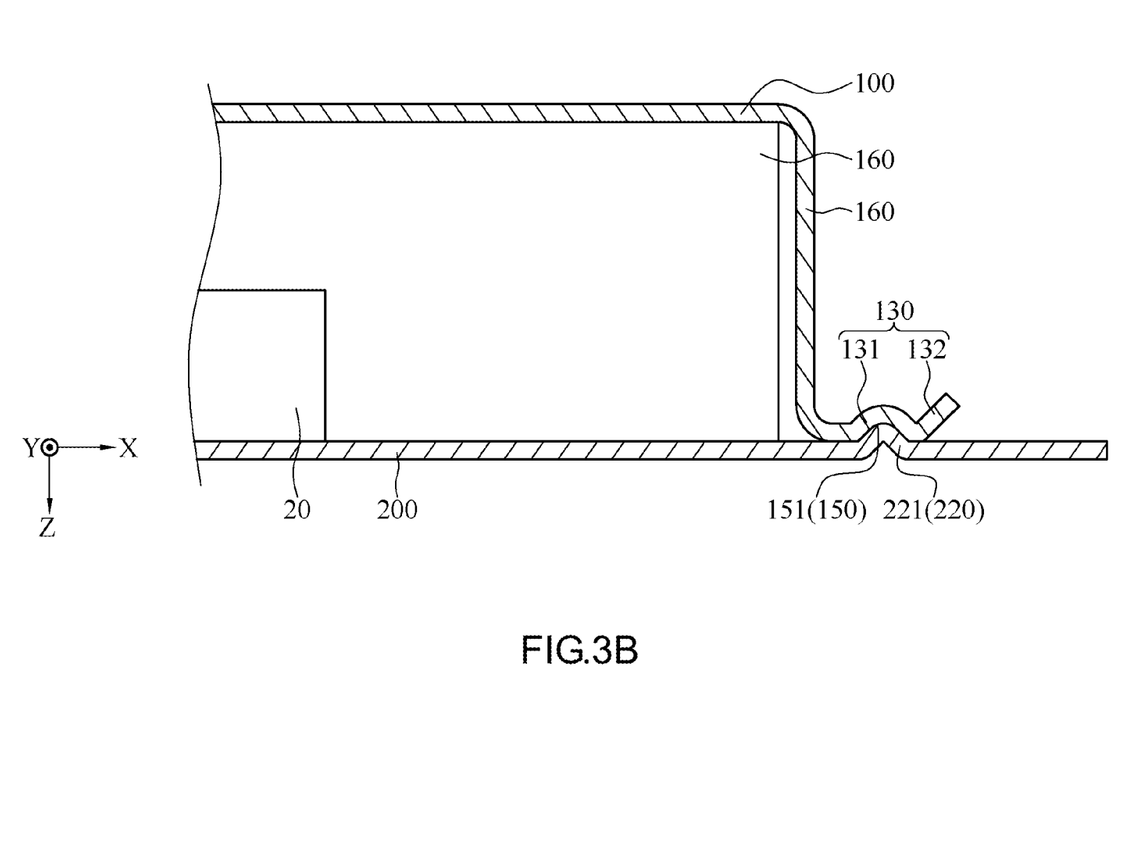
FIG. 3B is a section view of FIG. 3 along a section line 3B-3B.

Refer to FIG. 3B showing a section view of FIG. 3 along a section line 3B-3B. As shown in FIG. 3 and FIG. 3B, in this embodiment, the first coupling portion 150 comes into contact along the X-axis with the second coupling portion 220 and is coupled with the second coupling portion 220. At this point, the protrusion 221 and the recess 151 are mutually fitted, and the abutting section 131 presses against the plate 200 due to the elasticity of the elastic piece 130, in a way that the protrusion 221 is not easily disengaged from the recess 151. With the mutual coupling of the first coupling portion 150 and the second coupling portion 220, the relative positions of the housing 100 and the plate 200 in the X-axis can be fixed.

Figure 3C:
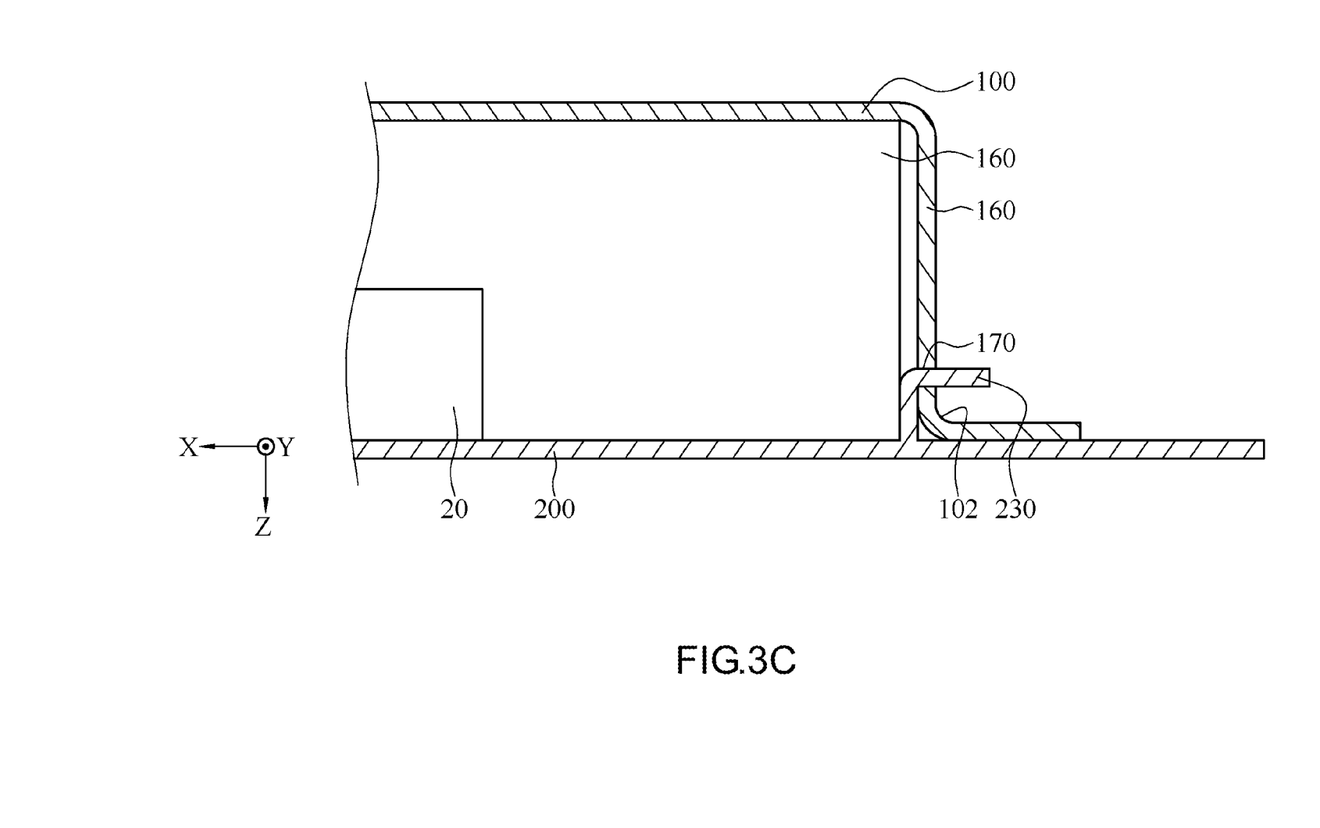
FIG. 3C is a section view of FIG. 3 along a section line 3C-3C.

Refer to FIG. 3C showing a section view of FIG. 3 along a section line 3C-3C. As shown in FIG. 3 and FIG. 3C, in this embodiment, along with the housing 100 that moves in the X-axis and relative to the plate 200 and the first coupling portion 150 that comes into contact along the X-axis and is coupled with the second coupling portion 220, the limiting plate 230 is also correspondingly inserted into the limiting hole 170. With the mutual coordination of the limiting board 230 and the limiting hole 170, the relative positions of the housing 100 and the plate 200 in the Z-axis and the Y-axis can be fixed.

As shown in FIG. 1 to FIG. 3C, in this embodiment, the housing 100 and the plate 200 provide a simple, fast and secure assembly. Further, disassembly of the housing 100 and the plate 200 is also quite convenient. For example, operation staff only needs to lift the warping section 132 by a finger to slightly separate the abutting section 131 from the plate 200, and then apply force at this point to push the housing 100 to move the housing 100 in the X-axis and to disengage the protrusion 221 from the recess 151 (referring to FIG. 2B); meanwhile, the limiting plate 230 also disengages from the limiting hole 170 (referring to FIG. 2C). Next, the operation staff can align the opening portion 140 with the hook portion 210 (referring to FIG. 2 and FIG. 2A), and can then lift the housing 100 along the Z-axis to remove the housing 100 from the plate 200.

As shown in FIG. 1, FIG. 2 and FIG. 3, in this embodiment, each first bent edge 110 includes an outer edge 111, which is away from the first side 101 and inclines relative to the first side 101. For example, the outer edge 111 inclines along an inclination direction DI, and two opposite outer edges 111 are mutually symmetrically inclined. For example, the first side 101 is parallel to the X-axis, and the outer edge 111 is not parallel to the X-axis. Correspondingly, an included angle is present between the outer edge 111 and the first side 101 on the XY plane. That is to say, a distance between one end of the outer edge 111 close to the limiting hole 170 and the first side 101 is greater than a distance between one end of the outer edge 111 close to the elastic piece 130 and the first side 101. Further, the first opening 141, the second opening 142 and the third opening 143 correspond to the outer edge 111 and are arranged in an inclined manner along the inclination direction DI. A distance between the first opening 141 and the first side 101 is smaller than a distance between the second opening 142 and the first side 101, and the distance between the second opening 142 and the first side 101 is smaller than a distance between the third opening 143 and the first side 101. Correspondingly, the first hook 211, the second hook 212 and the third hook 213 also correspond to the outer edge 111 and the opening portion 140, and are arranged in an inclined manner along the inclination direction DI.

For example, as shown in FIG. 2 and FIG. 2A, due to the inclined outer edge 111, an interval exists between the outer edge 111 of the first bent edge 110 behind the section line (i.e., the section line 2A-2A) and a bent wall 2111 of the first hook 211. As shown in FIG. 3 and FIG. 3A, when the first bent edge 110 enters the coupling portions and reaches a predetermined position, the outer edge 111 abuts against the bent wall 2111 of the first hook 211, and the outer edge 111 also correspondingly simultaneously abuts against bent walls (not denoted) of the second hook 212 and the third hook 213. The inclined outer edges 111 on two sides of the housing 100 can coordinate with the hook portions 210 provided in an inclined manner, achieving better assembly and securing effects. That is to say, when assembling the housing 100 to the plate 200 (as the assembly process shown in FIG. 2 to FIG. 3), the housing 100 moves in a forward direction in the X-axis and relative to the plate 200, until the inclined outer edge 111 abuts against the hook portion 210 provided in an inclined manner. At this point, the hook portion 210 prevents the outer edge 111 from continuously moving in a forward direction in the X-axis, thereby preventing the housing 100 that moves in a forward direction in the X-axis and relative to the plate 200 from moving beyond the predetermined position. Further, when the assembly of the housing 100 and the plate 200 is complete, the two rows of hook portions 210 on the plate 200 can further better clamp the two outer edges 111 on the two sides of the housing 100, such that housing 100 and the plate 200 can abut against each other in the Y-axis, hence reinforcing the securing effect.

In conclusion, in regard to the casing and the electronic device according to the embodiments of the present invention, assembly of the housing and the plate of the casing can be quickly completed without using screws and other types of tool, while providing the housing and the plate with a stable securing effect. Further, the housing and the plate can be conveniently disassembled. The casing of the present invention provides a time-saving and labor-saving assembly process, and is further capable of reducing overall material costs.

While the invention has been described by way of example and in terms of the embodiments, it is to be understood that the invention is not limited thereto. Modifications and similar arrangements and procedures can be made by a person skilled in the art without departing from the spirit and scope of the present invention. Therefore, the scope of the appended claims should be accorded with the broadest interpretation so as to encompass all such modifications and similar arrangements and procedures.

What is claimed is:

1. A casing, comprising:
   a housing, comprising two first sides opposite each other and two second sides opposite each other, the housing further comprising two bent edges opposite each other and an elastic piece, the two bent edges respectively located at the two first sides, the elastic piece located at one of the two second sides, each of the bent edges comprising an opening portion, the elastic piece comprising a first coupling portion; and
   a plate, comprising two hook portions and a second coupling portion, the two hook portions respectively protruding from the plate and respectively provided correspondingly to the two opening portions of the two bent edges, the second coupling portion provided correspondingly to the first coupling portion;
   wherein, when the two hook portions respectively pass in a first direction through the two opening portions, the two bent edges come into contact with the plate and respectively enter in a second direction a space between the hook portions and the plate, the first coupling portion comes into contact along the second direction with the second coupling portion and is coupled with the second coupling portion, the two hook portions limit a movement of the housing in the first direction, and the second coupling portion limits the movement of the housing in the second direction.

2. The casing according to claim 1, wherein each of the hook portions comprises a first hook and a second hook, the first hook and the second hook are provided at an interval in the second direction, each of the opening portions comprises a first opening and a second opening, the first opening is provided correspondingly to the first hook, and the second opening is provided correspondingly to the second hook.

3. The casing according to claim 2, wherein each of the bent edges comprises an outer edge, the outer edge is away from the first side and inclines relative to the first side, the first hook and the second hook correspond to the outer edge of the bent edge and are arranged in an inclined manner, and the outer edge of the bent edge abuts against the first hook and the second hook.

4. The casing according to claim 1, wherein the first coupling portion comprises a recess, the second coupling portion comprises a protrusion, and the protrusion is fitted in the recess.

5. The casing according to claim 1, wherein the elastic piece comprises an abutting section and a warping section, the abutting section is located between the warping section and the housing, the first coupling portion is located at the abutting section, the abutting section is in contact with the plate, and the waring section is away from the plate.

6. The casing according to claim 1, wherein the housing further comprises a limiting hole, the limiting hole is located at one other of the two second sides and is away from the elastic piece, the plate further comprises a protruding limiting plate, and the limiting plate is provided correspondingly to the limiting hole; when the first coupling portion comes into contact along the second direction with the second coupling portion and is coupled with the second coupling portion, the limiting plate is inserted in the limiting hole, and limits the movement of the housing in the first direction.

7. The casing according to claim 6, wherein the housing further comprises a wall, and the limiting hole is located on the wall.

8. The casing according to claim 1, wherein the first direction is perpendicular to the second direction.

9. The casing according to claim 8, wherein the two hook portions and the two bent edges further mutually abut in a third direction, the two hook portions limit the movement of the housing in the third direction, and the third direction is perpendicular to the first direction and the second direction.

10. An electronic device, comprising:
a casing, comprising:
a housing, comprising two first sides opposite each other and two second sides opposite each other, the housing further comprising two bent edges opposite each other and an elastic piece, the two bent edges respectively located at the two first sides, the elastic piece located at one of the two second sides, each of the bent edges comprising an opening portion, the elastic piece comprising a first coupling portion; and
a plate, comprising two hook portions and a second coupling portion, the two hook portions respectively protruding from the plate and respectively provided correspondingly to the two opening portions of the two bent edges, the second coupling portion provided correspondingly to the first coupling portion; and
a circuit board, provided on the plate, located between the plate and the housing;
wherein, when the two hook portions respectively pass in a first direction through the two opening portions, the two bent edges come into contact with the plate and respectively enter in a second direction a space between the hook portions and the plate, the first coupling portion comes into contact along the second direction with the second coupling portion and is coupled with the second coupling portion, the two hook portions limit a movement of the housing in the first direction, and the second coupling portion limits the movement of the housing in the second direction.

* * * * *